United States Patent
Lee et al.

(10) Patent No.: US 7,235,349 B2
(45) Date of Patent: Jun. 26, 2007

(54) PROCESS FOR FORMING AN ULTRA FINE PATTERN USING A BOTTOM ANTI-REFLECTIVE COATING FILM CONTAINING AN ACID GENERATOR

(75) Inventors: Sung Koo Lee, Seoul (KR); Jae Chang Jung, Seoul (KR); Geun Su Lee, Kyoungki-do (KR); Ki-Soo Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 33 days.

(21) Appl. No.: 11/321,126

(22) Filed: Dec. 29, 2005

(65) Prior Publication Data
US 2006/0183050 A1   Aug. 17, 2006

Related U.S. Application Data

(62) Division of application No. 10/321,123, filed on Dec. 17, 2002, now Pat. No. 7,138,218.

(30) Foreign Application Priority Data

Dec. 18, 2001   (KR)   ............... 2001-80577
Dec. 19, 2001   (KR)   ............... 2001-81010

(51) Int. Cl.
*G03F 7/00*   (2006.01)
*G03F 7/20*   (2006.01)
*G03F 7/26*   (2006.01)
*G03F 7/38*   (2006.01)
*G03F 7/40*   (2006.01)

(52) U.S. Cl. ............... 430/313; 430/270.1; 430/330; 430/913; 430/311; 430/918; 430/919

(58) Field of Classification Search ............ 430/270.1, 430/273.1, 311, 313, 330, 913, 918, 919
See application file for complete search history.

(56) References Cited

U.S. PATENT DOCUMENTS

| | | | |
|---|---|---|---|
| 5,212,043 A | 5/1993 | Yamamoto et al. |
| 5,750,680 A | 5/1998 | Kim et al. |
| 6,051,678 A | 4/2000 | Kim et al. |
| 6,132,926 A | 10/2000 | Jung et al. |
| 6,143,463 A | 11/2000 | Jung et al. |
| 6,150,069 A | 11/2000 | Jung et al. |

(Continued)

FOREIGN PATENT DOCUMENTS

EP   0789 278   8/1997

(Continued)

*Primary Examiner*—Amanda Walke
(74) *Attorney, Agent, or Firm*—Marshall Gerstein & Borun LLP

(57) ABSTRACT

A process of forming ultra fine patterns using bottom anti-reflective coating containing acid generator. More particularly, a process of forming vertical patterns using an organic bottom anti-reflective coating containing excessive amount of acid generator, in order to prevent formation of sloping patterns due to photoresist resins absorbing wavelength of light used as light sources during lithography process using light sources such as KrF, ArF, VUV, EUV, E-beam and ion beam, even when photoresist resins having high absorbance to light source are used.

16 Claims, 11 Drawing Sheets

U.S. PATENT DOCUMENTS

| | | |
|---|---|---|
| 6,180,316 B1 | 1/2001 | Kajita et al. |
| 6,225,020 B1 | 5/2001 | Jung et al. |
| 6,235,447 B1 | 5/2001 | Lee et al. |
| 6,235,448 B1 | 5/2001 | Lee et al. |
| 6,323,287 B1 | 11/2001 | Foster et al. |
| 6,355,400 B1 | 3/2002 | Tanaka et al. |
| 6,461,776 B1 | 10/2002 | Tanaka et al. |
| 6,610,808 B2 | 8/2003 | De et al. |
| 6,627,384 B1 | 9/2003 | Kim et al. |

FOREIGN PATENT DOCUMENTS

| | | |
|---|---|---|
| EP | 0 794 458 | 10/1997 |
| GB | 2340830 A | 3/2000 |
| GB | 2345286 A | 7/2000 |
| WO | WO 96/37526 | 11/1996 |
| WO | WO 97/33198 | 9/1997 |

PROCESS FOR FORMING AN ULTRA FINE PATTERN USING A BOTTOM ANTI-REFLECTIVE COATING FILM CONTAINING AN ACID GENERATOR

This is a divisional of U.S. Ser. No. 10/321,123, filed Dec. 17, 2002, now U.S. Pat. No. 7,138,218 the entire disclosure of which is incorporated herein by reference.

BACKGROUND

1. Technical Field

A process for forming ultra fine patterns using a bottom anti-reflective coating film containing an acid generator is disclosed. More specifically, a process for forming vertical patterns is disclosed that uses an organic bottom anti-reflective coating film containing excessive amount of an acid generator in order to prevent formation of sloping patterns due to the photoresist resins absorbing light of wavelength used as the light source, even when photoresist resins having a high absorbance to light source are utilized.

2. Description of the Related Art

A fine circuit of 150 nm L/S has been formed in a process of manufacturing semiconductor fine circuits using KrF of 248 nm, and an attempt has been recently made to form patterns of 150 nm or less. Further, a study on the process of manufacturing fine circuits using light sources having low wavelength such as ArF(193 nm), VUV(157 nm) and EUV (Extremely Ultraviolet; 13 nm) is underway.

However, it is difficult to develop photoresist resins having high permeability to these wavelengths. Because photoresist used in i-line(365 nm) and KrF(248 nm), wherein its resins consist of aromatic compounds, has high absorbance at the wavelength of 193 nm, the photoresist may not used in 193 nm wavelength. Therefore, photoresist for 193 nm wavelength is developing by using acrylic and alicyclic resins having no aromatic compound. Here, it is difficult to form good patterns because these resins have high absorbance to 193 nm wavelength.

FIG. 1a is a cross sectional view of the vertical pattern formed after development when a coated photoresist composition has low light absorbance. The amount of light reached on the upper portion of a photoresist 12 coated on an underlying layer 10 is approximately equivalent to the lower portion of a photoresist 12. As a result, vertical patterns 14 may be formed. However, when a chemically amplified photoresist is used, sloping patterns 18 is formed since more light exposure is performed on the upper portions of the photoresist 16 relative to the lower portion of the photoresist 16 (See FIG. 1b). In other words, sloping patterns may be formed because concentration gradient of acid generated by exposure is different according to the height in a vertical direction.

Although most studies have placed importance on developing resins having low absorbance to light source, this resin development has reached the limits when light sources such as VUV(157 mn) or EUV(13 nm) are used.

SUMMARY OF THE DISCLOSURE

Accordingly, a bottom anti-reflective coating film comprising an acid generator is disclosed to obtain vertical patterns when photoresist resins have high absorbance to light source.

A process for forming patterns which uses the bottom anti-reflective film is also disclosed.

DETAILED DESCRIPTION OF THE PRESENTLY PREFERRED EMBODIMENTS

A process of forming photoresist patterns is disclosed which uses a bottom anti-reflective coating composition comprising an excessive amount of acid generator.

A disclosed process for forming patterns comprises: (a) forming a bottom anti-reflective coating film by coating and baking a bottom anti-reflective coating composition on an underlying layer; (b) forming a photoresist film by coating and baking a photoresist composition on the bottom anti-reflective coating film; (c) exposing the resultant structure; (d) baking the resultant structure; and (e) developing the resultant structure to obtain ultra fine patterns.

Figure 1A:
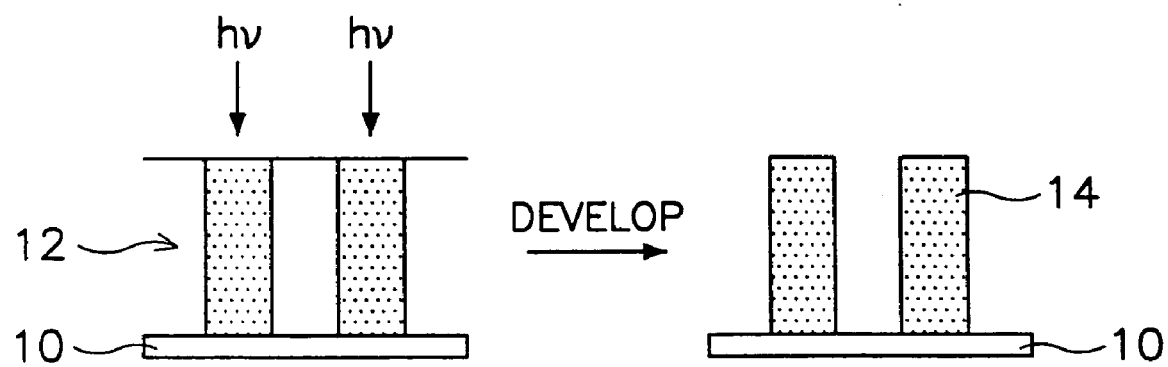
FIG. 1a is a cross sectional view of the vertical pattern formation when a coated photoresist composition has low light absorbance.
Figure 1B:
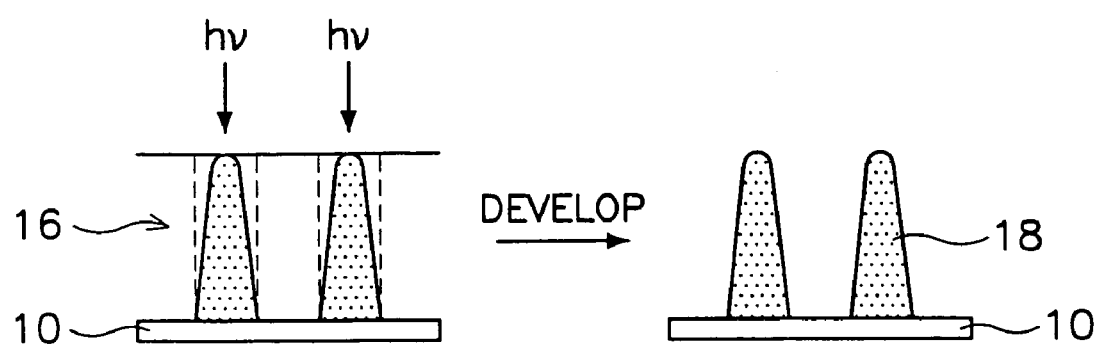
FIG. 1b is a cross sectional view of the sloping pattern formation when the coated photoresist composition has high light absorbance.

As described above, when photoresist has high absorbance to light source, the amount of light reached on an upper portion of photoresist is larger than that of a lower portion. Therefore, when a chemically amplified photoresist is used, the amount of acid on the upper portion of photoresist, generated by acid generator included in photoresist, becomes larger than that of the lower portion. As a result, sloping patterns may be formed as shown in FIG. 1b.

In order to overcome this problem, an excessive amount of an acid generator is added in a bottom anti-reflective coating composition. Acid generated from the acid generator is diffused in photoresist to supplement acid in a lower portion, thereby obtaining vertical patterns.

Figure 1C:
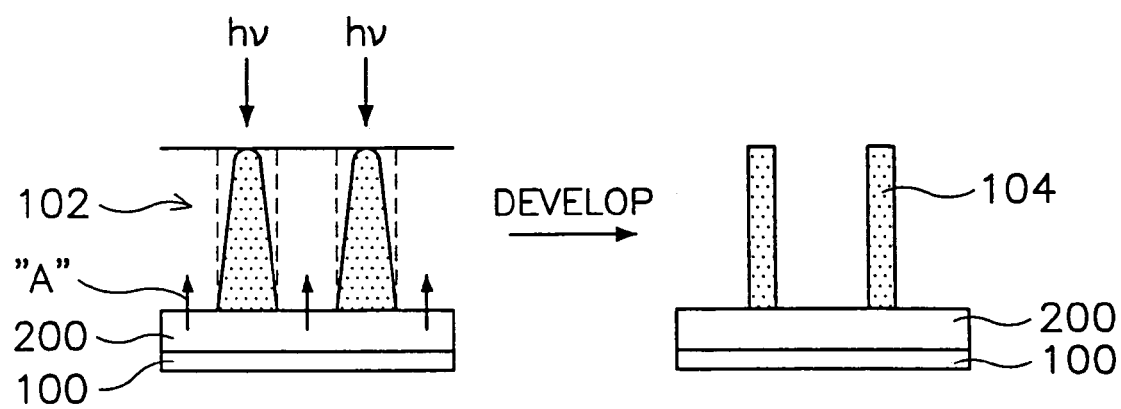
FIG. 1c is a cross sectional view of the pattern formation obtained in the present invention.

FIG. 1c is a cross sectional view of the pattern formation obtained in the present invention. A bottom anti-reflective coating film 200 containing acid generator is coated on an underlying layer 100, and a photoresist 102 is coated thereon. As a result, vertical patterns are obtained. Due to the photoresist 102 having high absorbance to light source, although the amount of light reached on the upper portion of the photoresist 102 is larger than that of the lower portion, acid A generated from the acid generator included in the bottom anti-reflective coating film 200 is diffused into the photoresist 102 to supplement acid formed in a lower portion, thereby obtaining vertical patterns 104.

A bottom anti-reflective coating composition of the present invention comprises an excessive amount of photoacid generator or thermal acid generator, more preferably, photoacid generator or thermal acid generator; a compound of Formula 1 as curing agent; polyvinylphenol of Formula 2, serving as photo-absorbent, as base resin; and organic solvent:

Formula 1

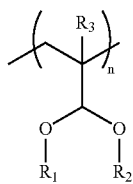

wherein $R_1$ and $R_2$ is linear or branched $C_1$-$C_{10}$ alkyl, and $R_3$ is hydrogen or methyl;

Formula 2

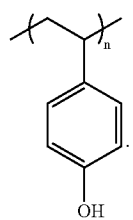

It is preferable that the compound of Formula 1 is selected from the group consisting of Formulas 1a to 1d:

Formula 1a

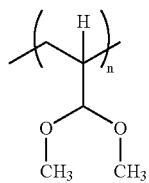

Formula 1b

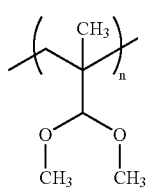

Formula 1c

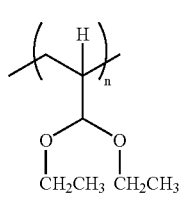

Formula 1d

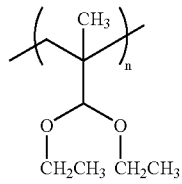

Any of conventional photoacid generator, which is able to generate acids when it is exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 5,750,680 (May 12, 1998), GB 2,340,830 A (Mar. 1, 2000), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). The photoacid generator is present in an amount ranging from 0.1 to 20 wt % of the gross weight of base resin and curing agent, preferably from 0.1 to 10 wt % of the gross weight of base resin and curing agent.

However, sloping patterns may result when the photoacid generator is present in an amount of below 0.1 wt %, and patterns may collapse when the photoacid generator is present in an amount of over 20 wt %.

The photoacid generator is selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-tert-butylphenylsulfonium triflate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and mixtures thereof.

Any of conventional thermal acid generator, which is able to generate acids when it is exposed to heat, can be used. Particularly, it is preferable that the thermal acid generator is selected from the group consisting of Formula 3, Formula 4 and mixtures thereof:

Formula 3

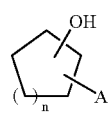

Formula 4

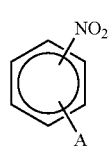

wherein A is a sulfonate group. Here, it is preferable that the A is

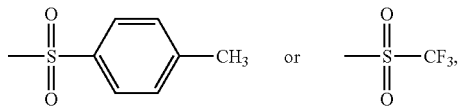

wherein n is 0 or 1.

The thermal acid generator is present in an amount ranging from 20 to 100 wt % of the gross weight of base resin and curing agent, preferably from 30 to 50 wt % of the gross weight of base resin and curing agent.

However, sloping patterns may be obtained when the thermal acid generator is present in an amount of below 20 wt %. When the thermal acid generator is present in an amount of over 100 wt %, the thermal acid generator is decomposed during the high thermal process, thereby generating residue on a hot plate.

In other words, the thermal acid generator exceeds in its amount because the thermal acid generator of the present invention is further added in the conventional bottom anti-reflective coating composition.

It is preferable that the compound of Formula 3 is represented by Formula 5, and that the compound of Formula 4 is represented by Formula 6:

Formula 5

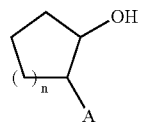

Formula 6

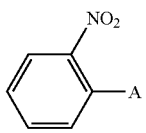

It is preferable that the compound of Formula 5 is selected from the group consisting of Formulas 5a to 5d, and that the compound of Formula 6 is selected from the group consisting of Formulas 6a to 6b:

Formula 5a

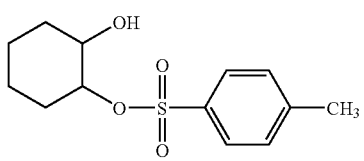

Formula 5b

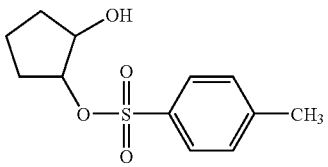

Formula 5c

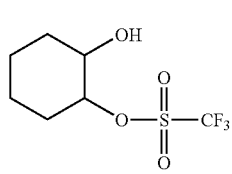

Formula 5d

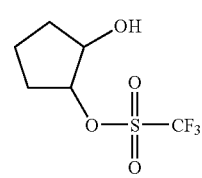

Formula 6a

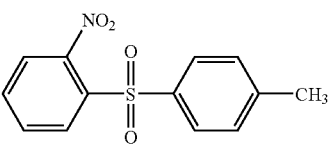

Formula 6b

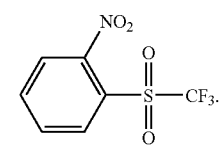

Any of conventional organic solvent can be used. Some of conventional organic solvents are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 5,750,680 (May 12, 1998), GB 2,340,830 A (Mar. 1, 2000), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferred organic solvents for the photoresist composition include methyl 3-methoxypropionate, ethyl 3-ethoxypropionate, propylene glycol methyl ether acetate, cyclohexanone, 2-heptanone, ethyl lactate or mixtures thereof.

There is also provided a semiconductor device manufactured according to the disclosed process for forming patterns as described above.

The disclosed process for forming patterns using bottom anti-reflective coating film will now be described in more details by referring to examples below, which are not intended to be limiting.

EXAMPLE 1

Measurement of Absorbance of Photoresist

DHA1001 photoresist [Dongjin Semichem Co.] was coated at a thickness of 1 μm on a quartz substrate, baked at 130° C. for 90 seconds, and then cooled at 23° C. The coated photoresist measures 46% in permeability via JASCO VUV 200 spectrometer.

EXAMPLE 2

Preparation of Curing Agent Included in Organic Bottom Anti-reflective Coating Composition Acrolein (100 g), THF (66 g) and AIBN (2 g) were added into a flask having round bottom (500 ml). In vacuum state, the resulting solution was reacted at a temperature of 65° C. for 5 hours. After reaction, a generated white solid (poly acrolein) was filtered, and then repeatedly washed with ethyl ether (yield 80%). After the white solid (80 g) and methanol (500 g) were added into a flask having round bottom (1000 ml) and trifluoromethyl sulfonic acid (1 ml) used as catalyst was also added therein, the resulting solution was reacted at room temperature for about 24 hours. The white solid (poly acrolein), which had not been dissolved at the initial stage, was dissolved in methanol as the reaction was completed. When it was confirmed that absorption band of 1690 cm$^{-1}$ disappeared after completion of the reaction in IR spectrum, the resulting solution was neutralized with triethylamine and then methanol therein was removed using distiller. When the resulting solution was turned into thick state, precipitation obtained from distilled water was vacuum-dried to obtain the compound of Formula 1a (yield 65%).

molecular weight 6,820; polydispersity 1.60;

$^1$H NMR 1.2~2.1 ppb(3H), 3.0~3.8 ppb(6H), 3.8~4.7 (1H).

EXAMPLE 3

Preparation of Organic Bottom Anti-reflective Coating Composition (1)

To 24.7 g of propyleneglycol methyletheracetate was added the curing agent (0.26 g) of Formula 1a obtained from Example 2 and the polyvinylphenol (0.455 g) of Formula 2. Here, the thermal acid generator (0.2 g) of Formula 5a was added, dissolved and then filtered using fine filter of 0.2 μm to obtain an organic bottom anti-reflective coating composition.

EXAMPLE 4

Preparation of Organic Bottom Anti-reflective Coating Composition (2)

To 24.7 g of propyleneglycol methyletheracetate was added the curing agent (0.26 g) of Formula 1a obtained from Example 2 and the polyvinylphenol (0.455 g) of Formula 2. Here, the thermal acid generator (0.3 g) of Formula 6a was added, dissolved and then filtered using fine filter of 0.2 μm to obtain an organic bottom anti-reflective coating composition.

EXAMPLE 5

Preparation of Organic Bottom Anti-reflective Coating Composition (3)

To 100 ml of organic bottom anti-reflective coating composition (Clariant 1C5D) was added the thermal acid generator (0.2 g) of Formula 5a, and dissolved to obtain an organic bottom anti-reflective coating composition.

EXAMPLE 6

Preparation of Organic Bottom Anti-reflective Coating Composition (4)

To 100 ml of organic bottom anti-reflective coating composition (Clariant 1C5D) was added the thermal acid generator (0.7 g) of Formula 6a, and dissolved to obtain an organic bottom anti-reflective coating composition.

EXAMPLE 7

Preparation of Organic Bottom Anti-reflective Coating Composition (5)

To 100 ml of organic bottom anti-reflective coating composition (Clariant 1C5D) was added the photoacid generator, triphenylsulfonium triplate (0.2 g), and dissolved to obtain an organic bottom anti-reflective coating composition.

EXAMPLE 8

Preparation of Organic Bottom Anti-reflective Coating Composition (6)

To 100 ml of organic bottom anti-reflective coating composition (Clariant 1C5D) was added the photoacid generator, diphenyl iodide hexafluoroantimonate (0.2 g), and dissolved to obtain an organic bottom anti-reflective coating composition.

EXAMPLE 9

Formation of Patterns (1)

The organic anti-reflective coating composition obtained from Example 3 was coated on a substrate at a thickness of 400 Å, baked at 220° C. for 90 seconds and then cooled at 23° C. to prepare a substrate having an organic bottom anti-reflective coating film.

Figure 2:
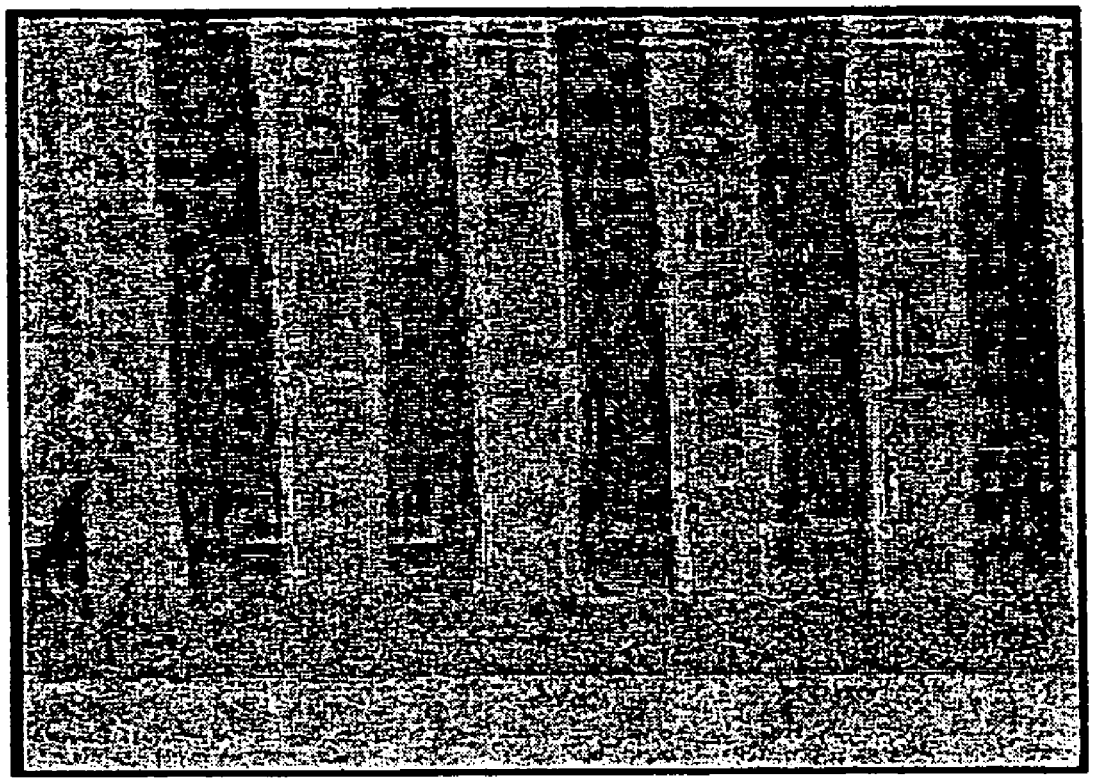
FIG. 2 shows a pattern obtained in Example 9.

The photoresist used in Example 1 was coated on the substrate at a thickness of 0.40 μm, baked at 130° C. for 90 seconds and then cooled at 23° C. The resultant structure was exposed using ArF exposing device of ASML Co. (PASS/900, NA=0.63), baked at 130° C. for 90 seconds and developed using TMAH aqueous solution of 2.38 wt % to obtain a vertical 120 nm L/S pattern (see FIG. 2).

EXAMPLE 10

Formation of Patterns (2)

Figure 3:
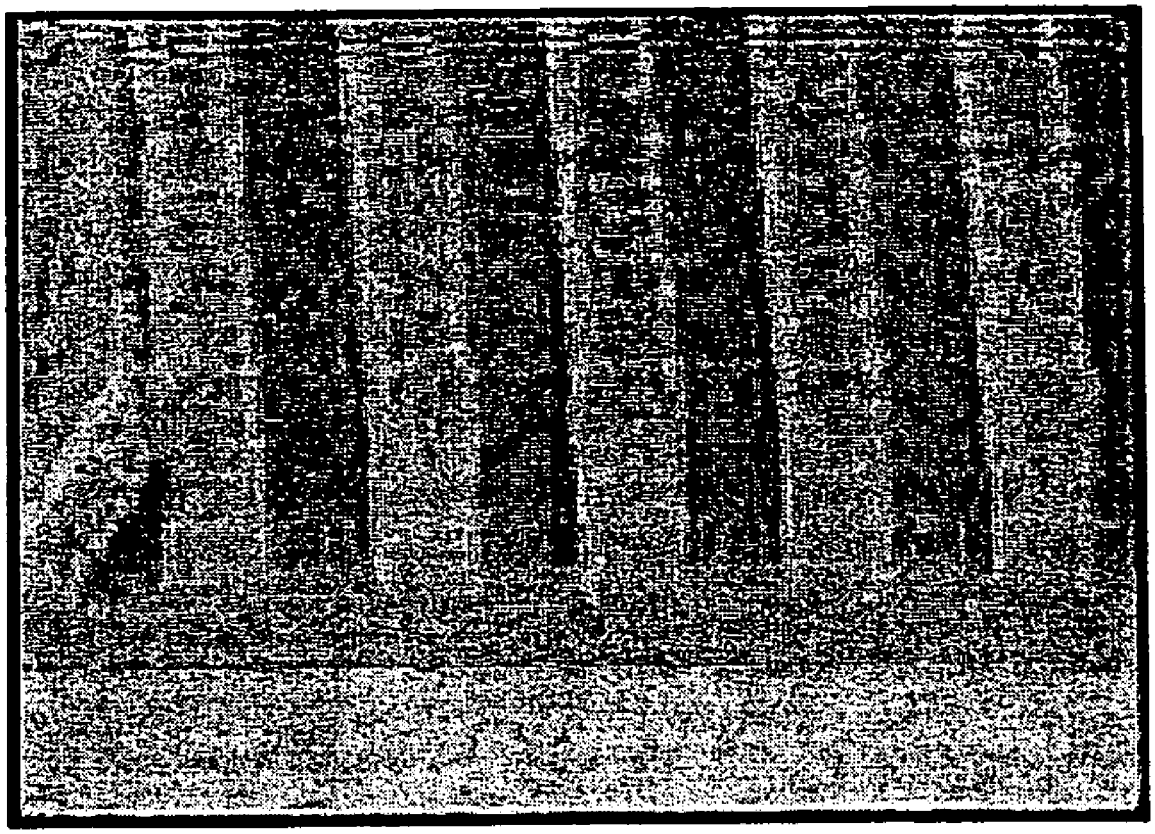
FIG. 3 shows a pattern obtained in Example 10.

The procedure of Example 9 was repeated but using the organic bottom anti-reflective coating composition obtained from Example 4 to obtain a vertical 120 nm L/S pattern (see FIG. 3).

EXAMPLE 11

Formation of Patterns (3)

Figure 4:
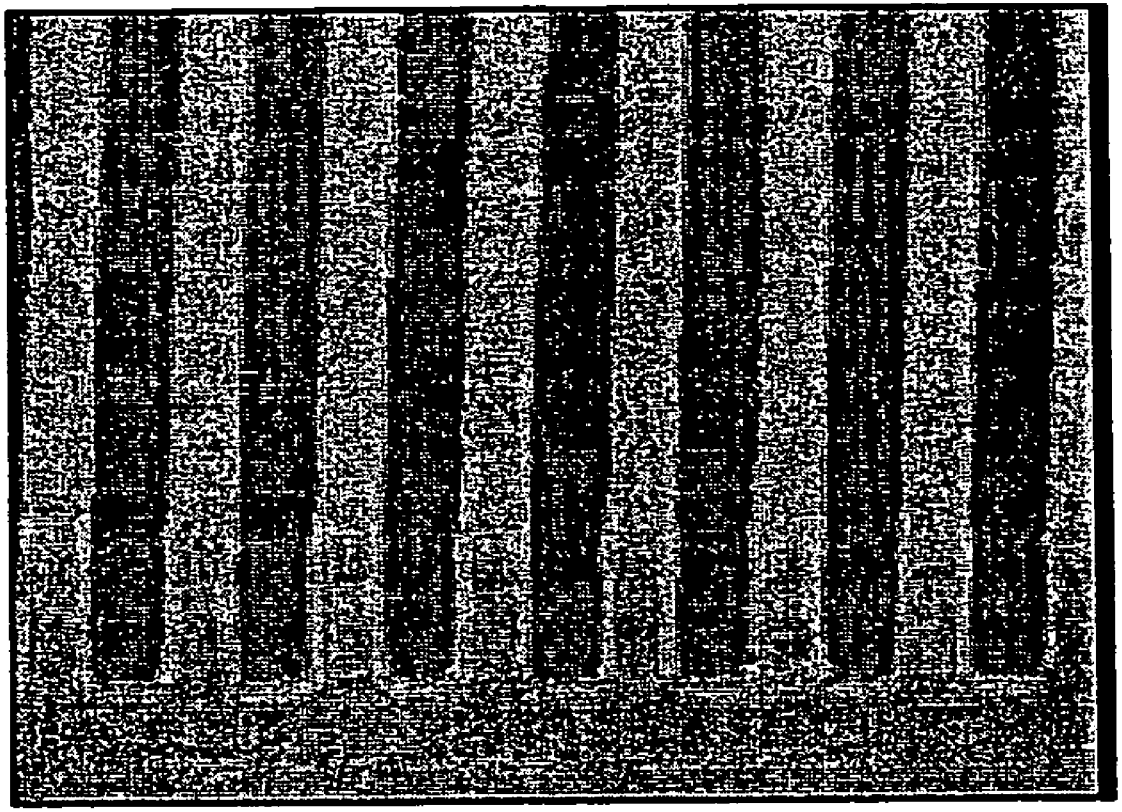
FIG. 4 shows a pattern obtained in Example 11.

The procedure of Example 9 was repeated but using the organic bottom anti-reflective coating composition obtained from Example 5 coated on a substrate at a thickness of 390 Å to obtain a vertical 120 nm L/S pattern (see FIG. 4).

EXAMPLE 12

Formation of Patterns (4)

Figure 5:
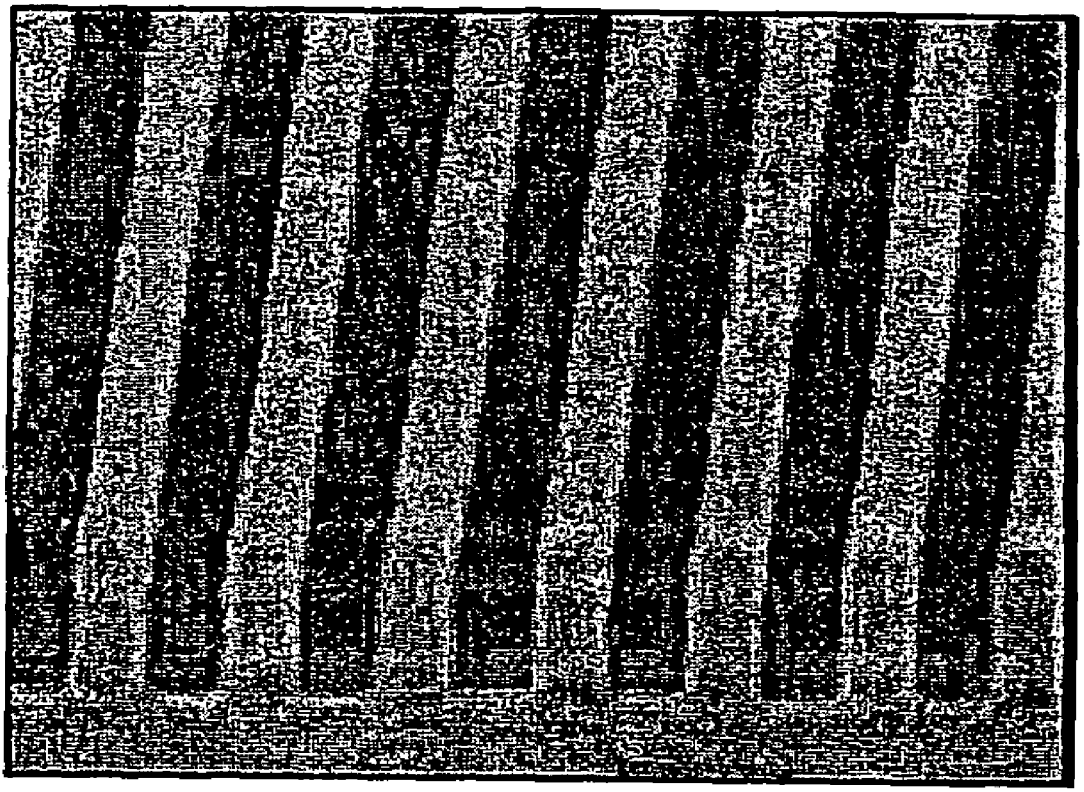
FIG. 5 shows a pattern obtained in Example 12.

The procedure of Example 9 was repeated but using the organic bottom anti-reflective coating composition obtained from Example 6 coated on a substrate at a thickness of 390 Å to obtain a vertical 120 nm L/S pattern (see FIG. 5).

EXAMPLE 13

Formation of Patterns (5)

The organic bottom anti-reflective coating composition obtained from Example 7 was coated on a substrate at a thickness of 390 Å, baked at 200° C. for 60 seconds and then cooled at 23° C. to prepare a substrate having an organic anti-reflective coating film.

Figure 6:
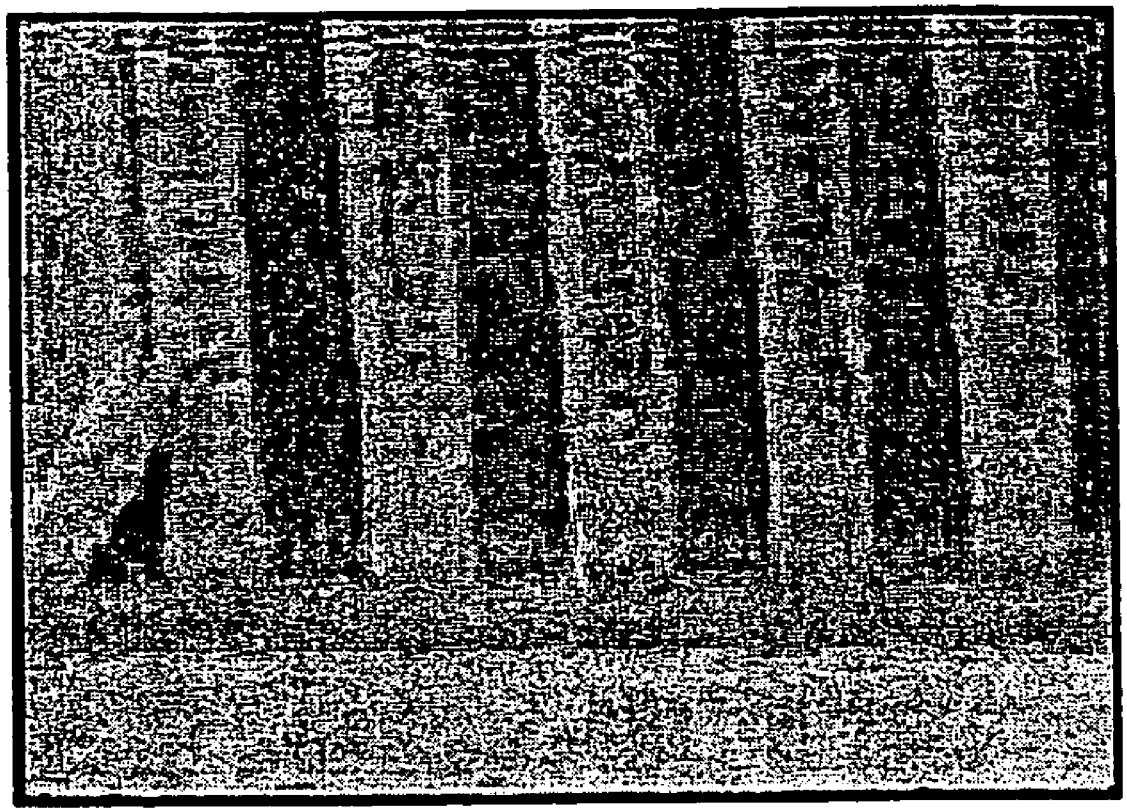
FIG. 6 shows a pattern obtained in Example 13.

The photoresist used in Example 1 was coated on the substrate at a thickness of 0.30 μm, baked at 130° C. for 90 seconds and then cooled at 23° C. The resultant structure was exposed using ArF exposing device of ASML Co. (PASS/900, NA=0.63), baked at 130° C. for 90 seconds and developed using TMAH aqueous solution of 2.38 wt % to obtain a vertical 120 nm L/S pattern (see FIG. 6).

EXAMPLE 14

Formation of Patterns (6)

Figure 7:
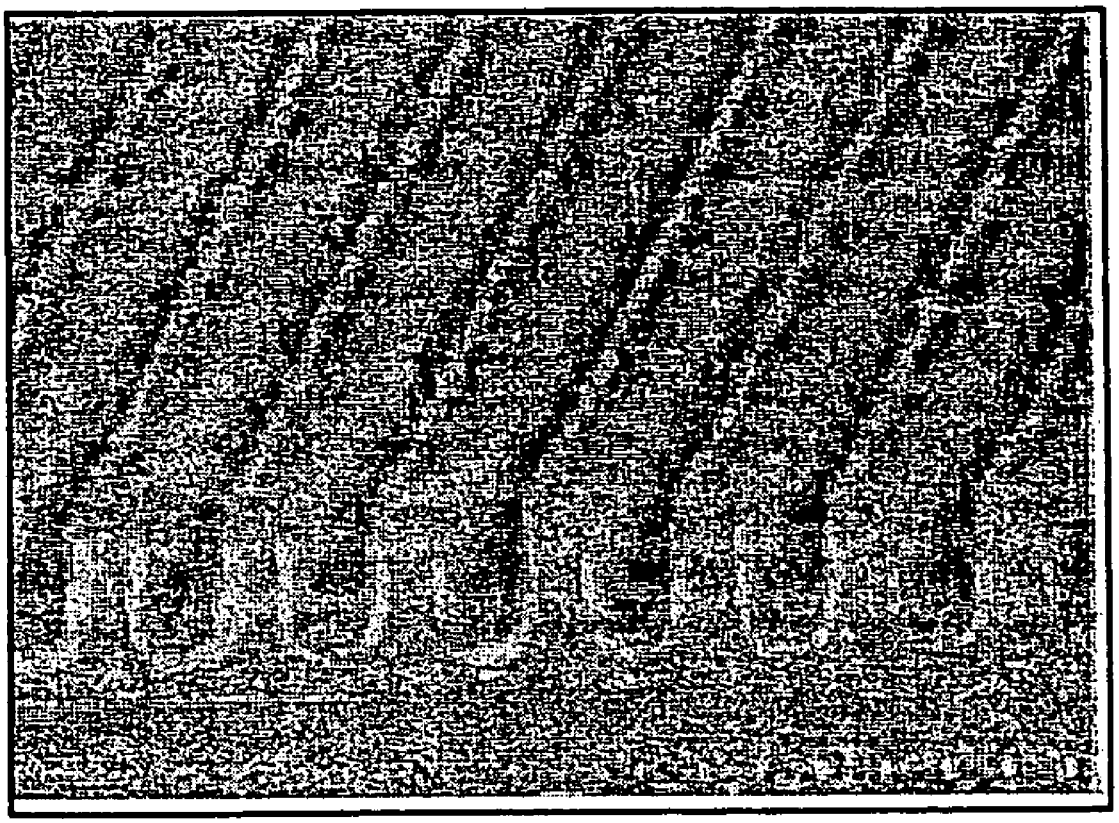
FIG. 7 shows a pattern obtained in Example 14.

The procedure of Example 13 was repeated but using the organic anti-reflective coating composition obtained from Example 8 to obtain a vertical 120 nm L/S pattern (see FIG. 7).

EXAMPLE 15

Preparation of Organic Anti-reflective Coating Composition Containing a Small Amount of Thermal Acid Generator To 24.7 g of propyleneglycol methyletheracetate was added the curing agent (0.26 g) of Formula 1a obtained from Example 2 and the polyvinylphenol (0.455 g) of Formula 2. Here, the thermal acid generator (0.04 g) of Formula 5a was added, dissolved and then filtered using fine filter of 0.2 μm to obtain an organic bottom anti-reflective coating composition.

EXAMPLE 16

Formation of Patterns

Figure 8:
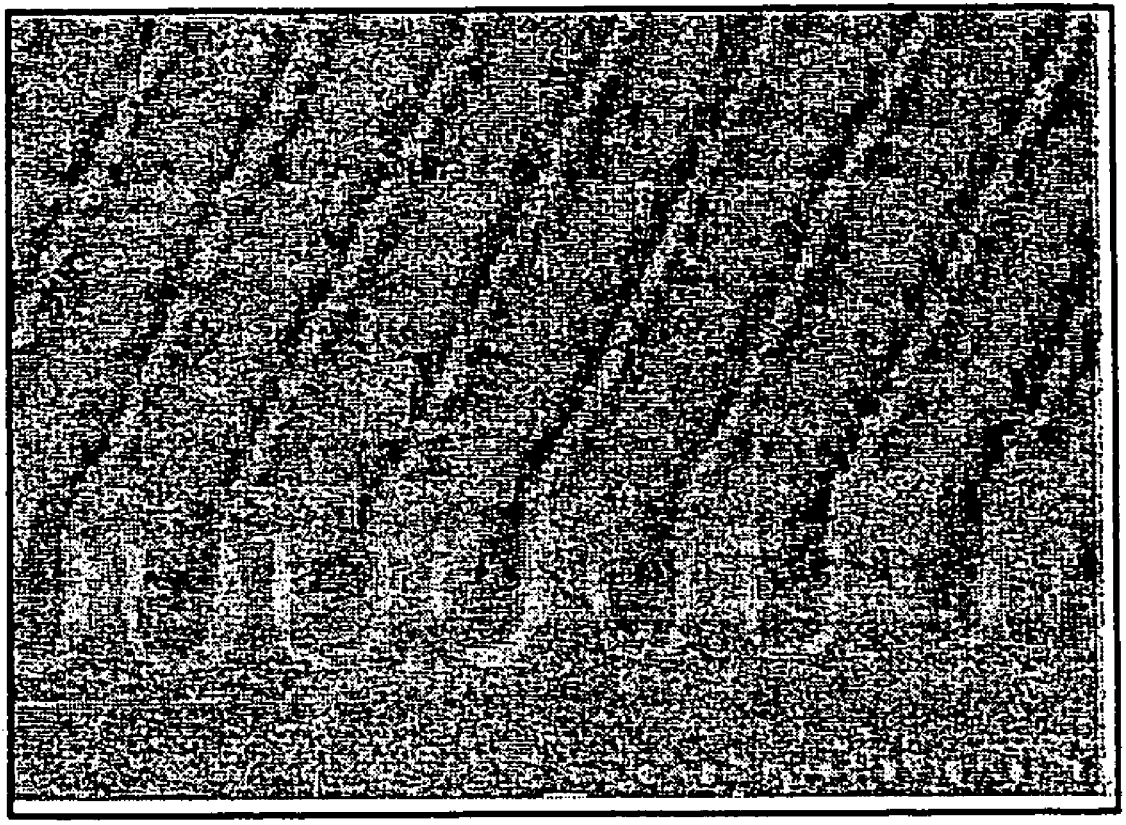
FIG. 8 shows a pattern obtained in Example 16.

The procedure of Example 9 was repeated but using the organic anti-reflective coating composition of Example 15 to obtain a sloping 120 nm L/S pattern (see FIG. 8).

COMPARATIVE EXAMPLE

Formation of Patterns

Figure 9:
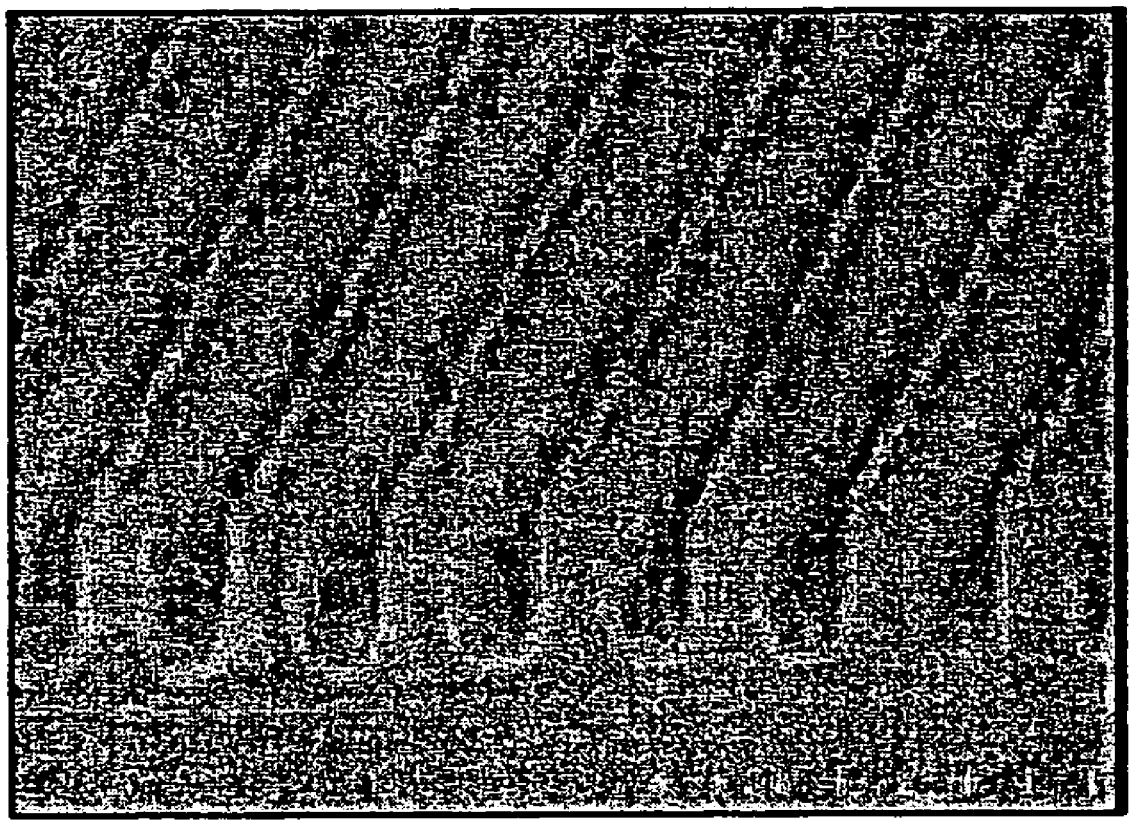
FIG. 9 shows a pattern obtained in Comparative Example.

The photoresist used in Example 1 was coated on the substrate coated with organic anti-reflective coating composition (Clariant 1C5D) at a thickness of 0.4 μm, baked at 130° C. for 90 seconds and then cooled at 23° C. The resultant structure was exposed using ArF exposing device of ASML Co. (PASS/900, NA=0.63), baked at 130° C. for 90 seconds and developed using TMAH aqueous solution of 2.38 wt % to obtain a sloping 120 nm L/S pattern (see FIG. 9).

As discussed earlier, patterns are formed using bottom anti-reflective coating film containing an excessive amount of acid generator. As a result, not sloping but vertical patterns may be obtained because acid is diffused into a lower portion of photoresist from the acid generator included in the bottom anti-reflective composition, although photoresist resins having high absorbance to light source are used, that is the amount of light reached on the lower portion of photoresist is smaller than that of a upper portion.

What is claimed is:

1. A process of forming photoresist patterns comprising:
   (a) forming a bottom anti-reflective coating film by coating and baking a bottom anti-reflective coating composition on an underlying layer;
   (b) forming a photoresist film by coating and baking a photoresist composition on the bottom anti-reflective coating film;
   (c) exposing the resultant structure;
   (d) baking the resultant structure; and
   (e) developing the resultant structure to obtain ultra fine patterns,
   wherein the bottom anti-reflective coating composition comprises a polyvinylphenol base resin of Formula 2, a curing agent compound of Formula 1, a solvent, and an acid generator;

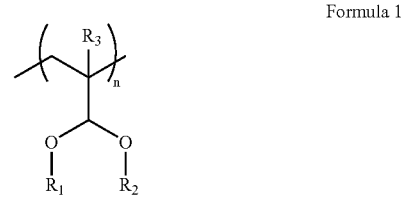

Formula 1 wherein $R_1$ and $R_2$ are linear or branched $C_1$-$C_{10}$ alkyl, and $R_3$ is hydrogen or methyl;

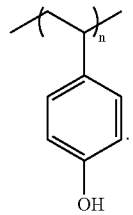

Formula 2

2. The process according to claim 1, wherein the acid generator is a photoacid generator.

3. A semiconductor device manufactured according to the process of claim 1.

4. The process according to claim 2, wherein the photoacid generator is present in an amount ranging from 0.1 to 20 weight percent (wt. %) of the gross weight of the base resin and the curing agent.

5. The process according to claim 2, wherein the photoacid generator is present in an amount ranging from 0.1 to 10 wt. % of the gross weight of the base resin and the curing agent.

6. The process according to claim 2, wherein the photoacid generator is selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-tert-butylphenylsulfonium triflate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate, and mixtures thereof.

7. The process according to claim 1, wherein the acid generator is a thermal acid generator.

8. The process according to claim 7, wherein the thermal acid generator is present in an amount ranging from 20 to 100 wt. % of the gross weight of base resin and curing agent.

9. The process according to claim 7, wherein the thermal acid generator is present in an amount ranging from 30 to 50 wt. % of the gross weight of base resin and curing agent.

10. The process according to claim 7, wherein the thermal acid generator is selected from the group consisting of Formula 3, Formula 4, and mixtures thereof:

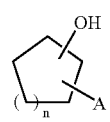

Formula 3

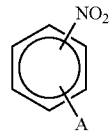

Formula 4 wherein A is a sulfonate group, and n is 1 or 2.

11. The process according to claim 10, wherein the sulfonate group of Formula 4 is

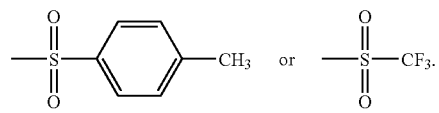

12. The process according to claim 10, wherein the compound of Formula 3 is represented by Formula 5:

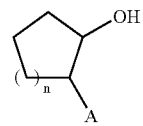

Formula 5 wherein A is a sulfonate group, and n is 1 or 2.

13. The process according to claim 10, wherein the compound of Formula 4 is represented by Formula 6:

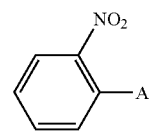

Formula 6 wherein A is a sulfonate group.

14. The process according to claim 12, wherein the compound of Formula 5 is selected from the group consisting of Formulas 5a to 5d:

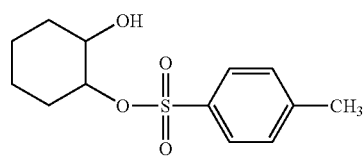

Formula 5a

Formula 5b
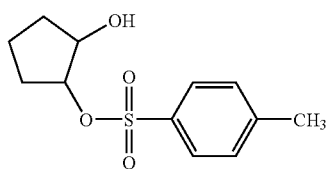
Formula 5c
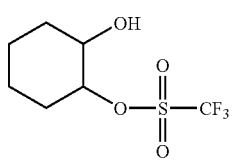
Formula 5d
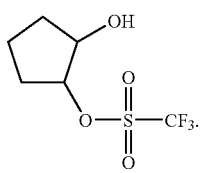
15. The process according to claim 13, wherein the compound of Formula 6 is selected from the group consisting of Formulas 6a to 6b:
Formula 6a
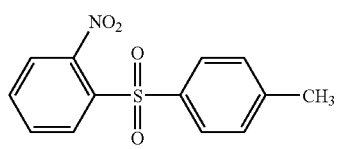
Formula 6b
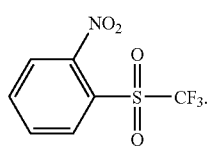
16. The process according to claim 1, wherein the compound of Formula 1 is selected from the group consisting of Formulas 1a to 1d:
Formula 1a
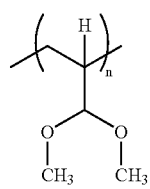
Formula 1b
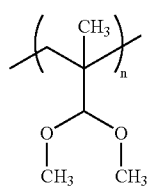
Formula 1c
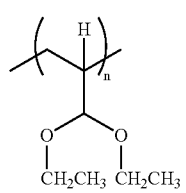
Formula 1d
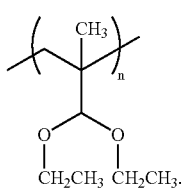
* * * * *